(12) United States Patent
Rolandi et al.

(10) Patent No.: US 6,559,709 B2
(45) Date of Patent: May 6, 2003

(54) LOW-CONSUMPTION CHARGE PUMP FOR A NONVOLATILE MEMORY

(75) Inventors: Paolo Rolandi, Voghera (IT); Massimo Montanaro, Pavia (IT); Giorgio Oddone, Rossiglione (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/821,827

(22) Filed: Mar. 28, 2001

(65) Prior Publication Data

US 2001/0046165 A1 Nov. 29, 2001

(30) Foreign Application Priority Data

Mar. 29, 2000 (EP) .............................................. 00830238

(51) Int. Cl.[7] .............................................. H02M 3/18
(52) U.S. Cl. ...................... 327/537; 327/536; 327/362; 327/378
(58) Field of Search ................................. 327/530, 536, 327/535, 537, 378, 362; 331/57, 176

(56) References Cited

U.S. PATENT DOCUMENTS

| 5,180,995 A | * | 1/1993 | Hayshi et al. ................ 331/57 |
| 5,543,750 A | | 8/1996 | Oh .............................. 327/589 |
| 5,907,484 A | * | 5/1999 | Kowshik et al. ............ 327/536 |
| 5,946,258 A | | 8/1999 | Evertt et al. ................. 365/226 |
| 6,294,963 B1 | * | 9/2001 | Shih et al. ................... 327/157 |

* cited by examiner

Primary Examiner—Dinh T. Le
(74) Attorney, Agent, or Firm—Lisa K. Jorgenson; E. Russell Tarleton; Seed IP Law Group PLLC

(57) ABSTRACT

A charge pump having a phase-generator circuit generating phase signals and an oscillator circuit supplying a clock signal, a current-limitation circuit to limit the current flowing in the oscillator circuit, and a control circuit supplying on an output a control signal supplied to the current-limitation circuit. The control circuit has a first current mirror connected to a ground line, a second current mirror connected to a supply line, a cascode structure arranged between the first and the second current mirrors and connected to the output of the control circuit to compensate the effects on the control signal caused by sharp relative variations between the potential of the supply line and the potential of the ground line, and a compensation circuit to compensate the effects on the control signal caused by sharp relative variations between the potential of the supply line and the potential of the ground line and by slow variations in temperature.

9 Claims, 2 Drawing Sheets

LOW-CONSUMPTION CHARGE PUMP FOR A NONVOLATILE MEMORY

TECHNICAL FIELD

The present invention pertains to a low-consumption charge pump for a nonvolatile memory.

BACKGROUND OF THE INVENTION

As is known, the most recent research in the sector of nonvolatile memories, in particular EPROM and FLASH memories, is aimed, on the one hand, at obtaining increasingly higher data storage capacity and, on the other, at obtaining memories that are able to work at a low voltage with increasingly contained consumption during standby.

This research has led to the development of submicrometric technologies which if, on the one hand, enable the production of ever smaller memory cells, thus increasing the capacity of the memory, on the other mean that threshold voltages of the memory cells become increasingly higher, with the result that increasingly higher reading voltages have to be supplied to the memory cells in order to guarantee constantly correct reading of these memory cells.

The reading voltages are currently obtained by means of charge pumps having the purpose of increasing the single supply voltage supplied from outside to the integrated device by such an amount as to enable attainment of the reading voltage necessary for the memory cell to deliver a sufficient reading current.

Generally, charge pumps are affected by far from negligible problems of consumption and of area occupied, especially when the memory devices into which they are built are used in applications that require reduced levels of consumption, such as portable applications (e.g., digital photo cameras, MP3 readers, cell phones, smart cards) or for consumer electronics.

In fact, the aforesaid charge pumps are used not only during the normal step of reading of the memory cells, but must also be able to withstand the boosted reading voltage during standby in order to guarantee that, upon re-entry from standby, an excessive drop in the reading voltage will not give rise to faulty reading or fail to guarantee a memory-read time that is in compliance with the specifications.

In particular, during memory standby, the charge pump supplies a current that is sufficient for compensating the leakage currents that are inevitably present in the integrated device, and this inevitably introduces, during standby, an additional consumption due to the charge pump and to the devices that control the operation of the charge pump.

Numerous solutions have so far been proposed to reduce the consumption of charge pumps.

In order to provide an example, FIG. 1 shows the schematic circuit diagram of one proposed low-consumption charge pump.

With reference to FIG. 1, the charge pump, designated as a whole by number 1, comprises a voltage-booster circuit 2 having an input 2a, on which an input voltage $V_{IN}$ is present, and an output 2b, on which an output voltage $V_{OUT}$ higher than the input voltage $V_{IN}$ is present, and being formed by a plurality of booster stages 4 cascaded between the input 2a and the output 2b, and each formed by a boost capacitor with a high capacitance and by a switch which is closed or opened alternately with the adjacent switch and is made by means of diodes (for example ones made using MOS transistors having gate and drain terminals connected together), or else by means of MOS transistors.

Transfer of charge from one booster stage 4 to the next towards the output 2b is upon command of complementary phase signals supplied at input to the booster stages 4 and generated by a phase-generator circuit 6, which is a logic circuit of a generally known type and essentially consists of a ring oscillator 8 supplying on its own output a clock signal CK having a pre-set frequency and of a non-overlapping-signal generator 10 having an input connected to the output of the ring oscillator 8 and supplying at output a first logic phase signal A and a second logic phase signal B, supplied to the booster stages 4.

In particular, as shown in detail in FIG. 2, the ring oscillator 8 comprises an odd number of inverter stages (three, in the example illustrated), designated by 12.1, 12.2, and 12.3, which are cascaded together, and each of which comprises a PMOS transistor 14.1, 14.2, 14.3 and an NMOS transistor 16.1, 16.2, 16.3, having gate terminals connected together and defining an input node 18.1, 18.2, 18.3 of the inverter stage, and drain terminals connected together and defining an output node 20.1, 20.2, 20.3 of the inverter stage.

Each PMOS transistor 14.1, 14.2, 14.3 has moreover a source terminal directly connected to a supply line 20 set at the supply voltage $V_{DD}$, typically 1–3V, whilst each NMOS transistor 16.1, 16.2, 16.3 has moreover a source terminal connected to a ground line 22 set at the ground voltage $V_{GND}$, typically 0 V, via a respective limitation NMOS transistor 24.1, 24.2, 24.3 having a drain terminal connected to the source terminal of the corresponding NMOS transistor 16.1, 16.2, 16.3, a source terminal connected to the ground line 22, and a gate terminal connected to a common biasing circuit 26, which is connected to the supply line 20 and supplies, to the gate terminals, a constant biasing voltage $V_{REF}$ generated starting from the supply voltage $V_{DD}$.

In addition, the output node 20 of an inverter stage 12 is connected to the input node 18 of the subsequent inverter stage 12 in the cascade, and the output node 20 of the last inverter stage 12 in the cascade is connected to the input node 18 of the first inverter stage 12 in the cascade.

The ring oscillator 8 further comprises a first capacitor 28 and a second capacitor 30 connected, respectively, between the output node 20.1 and the ground line 22, and between the output node 20.2 and the ground line 22, and have the purpose of determining the oscillation frequency of the ring-oscillator stage 8.

The operation of the ring oscillator 8 is in itself known and consequently will not be described in detail hereinafter.

Here it is only pointed out that reduction in the consumption of the charge pump 1 is obtained due to the introduction of the limitation transistors 24.1, 24.2, 24.3, that perform the function of limiting the crowbar current that flows between the supply line 20 and the ground line 22 via the PMOS transistors 14.1, 14.2, 14.3 and the NMOS transistors 16.1, 16.2, 16.3 during switching of the inverter stages 12.1, 12.2, 12.3.

In fact, since the limitation transistors 24.1, 24.2, 24.3 have gate terminals biased at a constant biasing voltage $V_{REF}$, they in practice operate as constant-current generators, and since these transistors are arranged in series with the corresponding PMOS transistors 14.1, 14.2, 14.3 and NMOS transistors 16.1, 16.2, 16.3 between the supply line 20 and the ground line 22, the crowbar current of each inverter 12.1, 12.2, 12.3 can in no way exceed the current imposed by the limitation transistors 24.1, 24.2, 24.3.

The above-mentioned constant-current generators are then controlled by the biasing circuit 26, which in practice constitutes a control circuit supplying to the gate terminals of the limitation transistors 24.1, 24.2, 24.3 a control signal consisting of the biasing voltage $V_{REF}$, as a function of which the crowbar current of the inverters 12.1, 12.2, 12.3 can be regulated.

Although extensively used, the charge pumps of the type described above still present certain drawbacks that do not enable adequate exploitation of certain desirable advantages.

In the first place, the biasing circuits 26 that are currently used for biasing the gate terminals of the limitation transistors provided inside the ring-oscillator stages have a multi-stage structure and are of the so-called band-gap type, which use bipolar transistors and resistors, and this type of biasing circuit typically presents, in addition to a considerable circuit complexity, also a non-negligible consumption and occupation of area.

In the second place, although the biasing voltages $V_{REF}$ generated by the biasing circuits of the type described above are relatively not very sensitive to variations in the working temperature, they are, instead, rather sensitive to the variations in the supply voltage $V_{DD}$, and this sensitivity inevitably also reflects on the levels of consumption of the oscillators biased by the said circuits, with the result that the levels of consumption cannot be kept within the specifications required in any operating conditions.

SUMMARY OF THE INVENTION

The disclosed embodiment of the present invention provides a low-consumption charge pump that is able to deliver a constant output voltage as the temperature and supply voltage vary.

According to the present invention, a low-consumption charge pump for a nonvolatile memory is provided, the charge pump including a phase-generating circuit configured to generate phase signals and a voltage-boosting circuit configured to receive the phase signals, the phase-generating circuit including signal-generating circuits supplying on an output a clock signal, first current-limiting component for limiting the current flowing in the signal-generating circuits, and a control circuit supplying on an output a control signal supplied to the current-limiting component, the control circuit including a first current mirror connected to a first line set at a first potential, a second current mirror connected to a second line set at a second potential, and a cascode structure arranged between the first and second current mirrors and connected to the output of the control circuit for compensating effects on the control signal caused by sharp relative variations between potentials on the first and second potentials, the control circuit further including a compensation circuit configured to compensate for effects on the control signal caused by slow relative variations between the potentials and by slow variations in temperature.

BRIEF DESCRIPTION OF THE DRAWINGS

For a better understanding of the present invention, a preferred embodiment thereof is now described, merely to provide a non-limiting example, with reference to the attached drawings, in which.

DETAILED DESCRIPTION OF THE INVENTION

Figure 1:
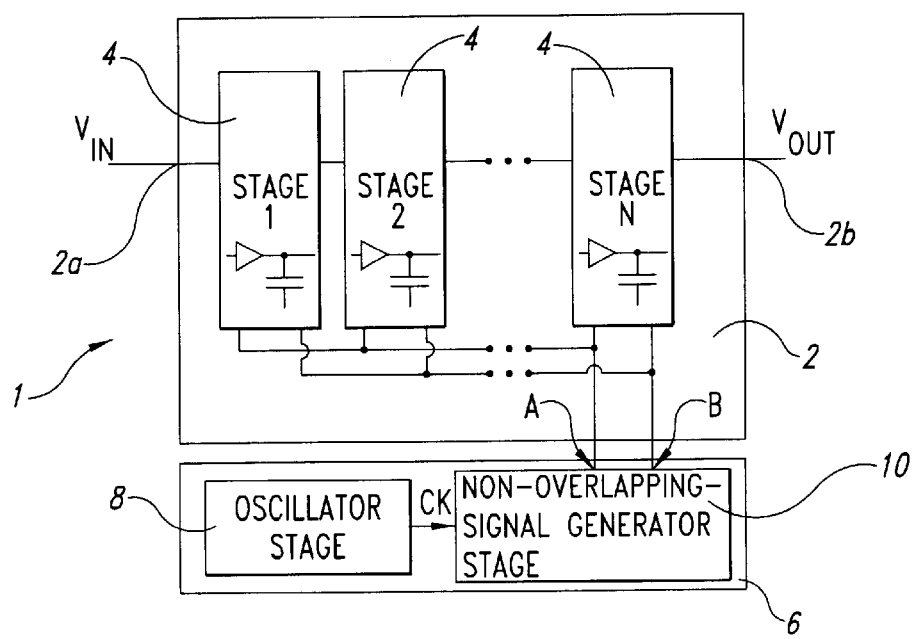
FIG. 1 shows a circuit diagram of a known charge pump.
Figure 2:
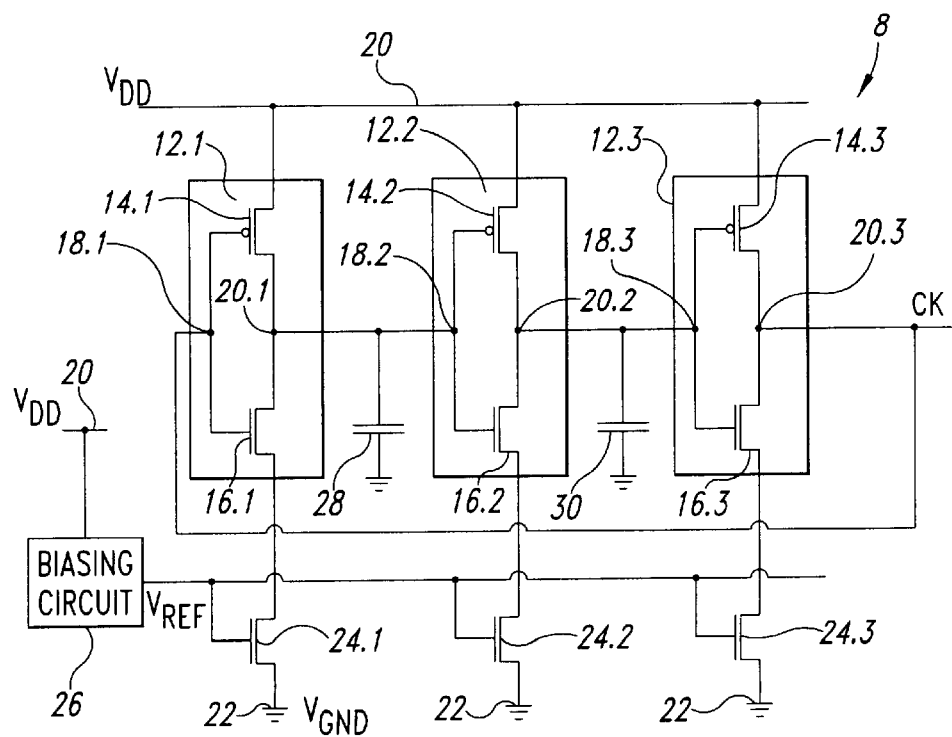
FIG. 2 shows a circuit diagram of a current-controlled oscillator forming part of the charge pump of FIG. 1.
Figure 3:
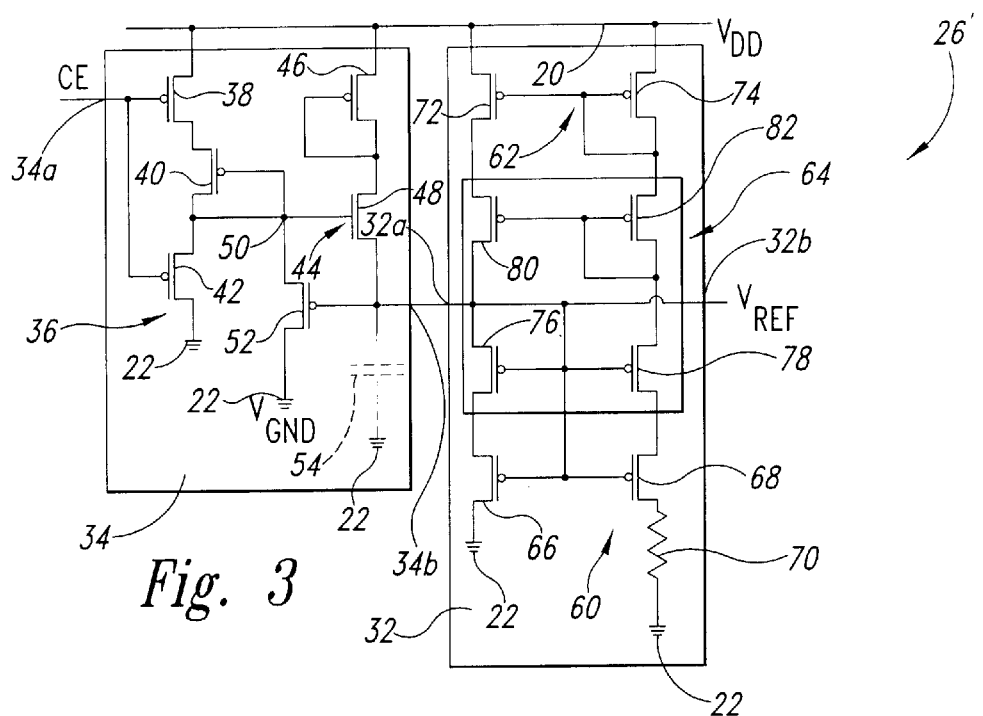
FIG. 3 shows the circuit diagram of a biasing circuit made according to the present invention.

The present invention envisages biasing of the gate terminals of the limitation transistors 24.1, 24.2, 24.3 illustrated in FIG. 2 using a biasing circuit of the type illustrated in FIG. 3.

With reference to FIG. 3, the biasing circuit, designated as a whole by 26', comprises a voltage-generator stage 32 supplying, on its own output 32a, the aforementioned biasing voltage $V_{REF}$, and a start-up stage having an input 34a receiving an enabling signal CE, for example, the so-called chip-enable signal, and an output 34b connected to the output 32a of the voltage-generator stage 32 and having the purpose of initializing correctly the voltage-generator stage 32 during the power-up step of the charge pump 1, as will be described in greater detail in what follows.

The start-up stage 34 comprises an input branch 36 formed by two PMOS transistors 38, 40 and of an NMOS transistor 42 connected together in series, and an output branch 44 formed by a PMOS transistor 46 and an NMOS transistor 48 connected together in series.

In particular, the PMOS transistor 38 has a gate terminal connected to the input 34a of the start-up stage 34 and receiving the enabling signal CE, a source terminal connected to the supply line 20, and a drain terminal connected to the source terminal of the PMOS transistor 40, the gate and drain terminals of which are connected together and to the drain terminal of the NMOS transistor 42, and define an intermediate node 50. The NMOS transistor 42, instead, has a gate terminal connected to the input 34a of the start-up stage 34 and receiving the enabling signal CE, and a source terminal connected to the ground line 22.

The PMOS transistor 46 has a source terminal connected to the supply line 20 and gate and drain terminals connected together and to the drain terminal of the NMOS transistor 48, which in turn has a source terminal connected to the output 34b of the startup stage 34 and a gate terminal connected to the intermediate node 50.

An NMOS transistor 52 is moreover connected between the intermediate node 50 and the ground line 22. In particular, the NMOS transistor 52 has a drain terminal connected to the intermediate node 50, a source terminal connected to the ground line 22, and a gate terminal connected to the output 34b of the start-up stage 34.

Finally, between the output 34b of the start-up stage 34 and the ground line 22, a stabilization capacitor 54 may moreover be optionally provided, this being illustrated with a dashed line in FIG. 3.

The voltage-generator stage 32 has a double-mirror cascode structure and comprises a first current mirror 60, a second current mirror 62, and a proper cascode structure 64 arranged between the first and the second current mirrors 60, 62 to increase the impedance seen by the supply line 20 and the ground line 22, and, consequently, to increase the so-called "power supply rejection ratio" (PSRR) of the voltage-generator stage 32.

In particular, the first current mirror 60 comprises an NMOS transistor 66 and an NMOS transistor 68 which operate in subthreshold condition. The NMOS transistor 66 has a gate terminal connected to the gate terminal of the NMOS transistor 68 and to the output 32a of the voltage-generator stage 32, a source terminal connected to the ground line 22, and a drain terminal connected to the cascode structure 64, whilst the NMOS transistor 68 has a drain terminal connected to the cascode structure 64 and a source terminal connected to the ground line 22 via a resistor 70 having a thermal coefficient, defined as the variation of its resistance with temperature, with sign opposite to that of the thermal voltage $V_T=KT/q$ of the NMOS transistors 66, 68 (a voltage which, as is known, appears in the formula of the subthreshold current).

The second current mirror 62 comprises a PMOS transistor 72 and a PMOS transistor 74 which operate in saturation. The PMOS transistor 72 has a gate terminal connected to the gate terminal of the PMOS transistor 74, a source terminal connected to the supply line 20, and a drain terminal connected to the cascode structure 64, whilst the PMOS transistor 74 has a drain terminal connected to its own gate terminal and to the cascode structure 64, and a source terminal connected to the supply line 20.

The cascode structure 64 comprises two NMOS transistors 76, 78 and two PMOS transistors 80, 82.

The NMOS transistors 76, 78 have gate terminals connected together, to the gate terminals of the NMOS transistors 66, 68, and to the output terminal 32a of the voltage-generator stage 32, source terminals connected, respectively, to the drain terminal of the NMOS transistor 66 and to the drain terminal of the NMOS transistor 68, and drain terminals connected, respectively, to the drain terminal of the PMOS transistor 80 and to the drain terminal of the PMOS transistor 82, the PMOS transistors 80, 82 in turn having gate terminals connected together and to the drain terminal of the PMOS transistor 82, and source terminals connected, respectively, to the drain terminal of the PMOS transistor 72 and to the drain terminal of the PMOS transistor 74.

The drain terminals of the NMOS transistor 76 and of the PMOS transistor 80, besides being connected together, are also connected to the output 32a of the voltage-generator stage 32.

The operation of the biasing circuit 26' is described below.

The PMOS transistors 72, 74 of the second current mirror 62 operate in saturation and have the sole function of rendering equal the currents flowing in the two branches of the voltage-generator stage 32.

The NMOS transistors 66, 68 of the first current mirror 60 and the resistor 70, together with the subthreshold operating condition of the NMOS transistors 66, 68, define a static-compensation structure which is able to offset the effects that the slow variations in time of the temperature and of the supply voltage $V_{DD}$ have on the biasing voltage $V_{REF}$.

In particular, given that the NMOS transistors 66, 68 operate in subthreshold condition and that the resistor 70 constitutes a degeneration resistance R arranged on the source terminal of the NMOS transistor 68, the current flowing in the resistor 70, and hence in the transistors 66, 68, is I=(GVO$_{68}$–GVO$_{66}$)/R, where GVO$_{68}$ and GVO$_{66}$ are the gate voltage overdrive present, respectively, on the gate terminal of the NMOS transistor 68 and on the gate terminal of the NMOS transistor 66 (defined as the difference between the gate-to-source voltage and the threshold voltage, namely GVO=VGS–VTH).

The current I flowing in the resistor 70 is independent of the supply voltage $V_{DD}$. In fact, an increase in the current I flowing through the resistor 70, which is generated by a variation in the supply voltage $V_{DD}$, determines an increase in the voltage drop across the resistor 70, and hence a decrease in the source-to-gate voltage VGS of the NMOS transistor 68 and, consequently, of the current flowing in the NMOS transistors 66, 68.

The independence of the biasing voltage $V_{REF}$ from the variations in temperature is, instead, obtained simply thanks to the fact that the resistor 70 has a thermal coefficient with a sign opposite to that of the thermal voltage $V_T$=KT/q, which regulates the subthreshold current of the NMOS transistors 66, 68.

The cascode structure 64, instead, constitutes a dynamic-compensation structure that is able to offset the variations in the biasing voltage $V_{REF}$ that are generated by sharp variations in time of the supply voltage $V_{DD}$.

In particular, the NMOS transistors 76, 78 and the PMOS transistors 80, 82 perform the function of increasing the impedance seen by the supply line 20 and ground line 22 and, consequently, also the power supply rejection ratio (PSRR) of the voltage-generator stage 32, and the higher the PSRR, the higher the insensitivity of the biasing voltage $V_{REF}$ to the sharp variations of the supply voltage $V_{DD}$.

With the solution proposed, the PSRR of the voltage-generator stage 32 turns out to be equal to −75 dB, a decidedly high value which guarantees the substantial insensitivity of the biasing voltage $V_{REF}$ to sharp variations in the supply voltage $V_{DD}$.

The start-up stage 34, instead, performs the function of starting up the voltage-generator stage 32 correctly at turning-on of the biasing circuit 26'. In fact, the voltage-generator stage 32 presents two stable working points: the first one, with zero current and zero biasing voltage $V_{REF}$, and the second one coinciding with the desired working point. In the absence of the start-up stage 34, the voltage-generator stage 32 would tend to remain in the initial state in which both the current and the biasing voltage are zero.

Upon turning-on of the biasing circuit 26', for example when the enabling signal CE switches to the low logic level, the PMOS transistor 38 turns on and progressively charges the capacitance associated to the node 50, thus progressively sending this node to a high logic level.

When the voltage present on the node 50 exceeds the threshold voltage of the NMOS transistor 48, the latter turns on, thus charging the capacitance associated to the output 32a of the voltage-generator stage 32 and to the output 34b of the start-up stage 34.

In this way, there is a progressive rise in the biasing voltage $V_{REF}$, which progressively moves towards the above-mentioned second stable working point.

When the biasing voltage $V_{REF}$ exceeds the threshold voltage of the NMOS transistor 52, the latter progressively turns on, gradually discharging the node 50 and thus determining gradual turning-off of the start-up stage 34.

The biasing voltage $V_{REF}$ can then continue to evolve towards the second stable working point in the way imposed by the voltage-generator stage 32.

Figure 4:
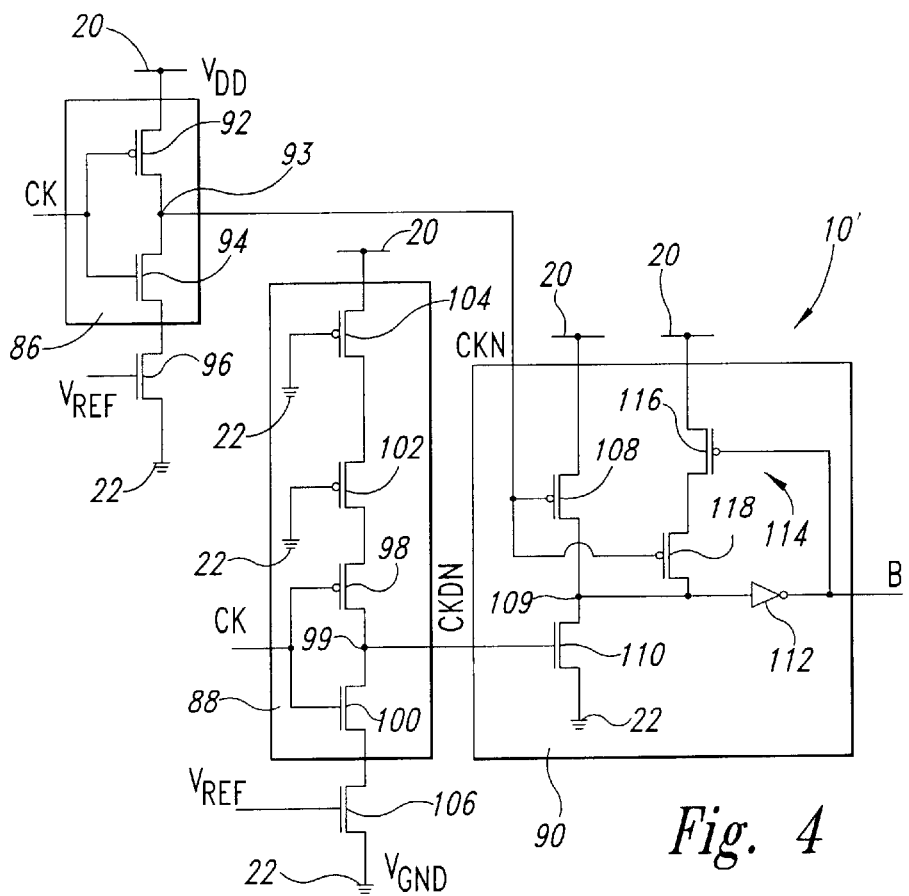
FIG. 4 shows a circuit diagram of a non-overlapping-signal generator made according to the present invention.

FIG. 4 shows the circuit diagram of a non-overlapping-signal generator stage according to the present invention.

With reference to FIG. 4, the non-overlapping-signal generator stage, designated as a whole by 10', comprises a first inverter stage 86 and a second inverter stage 88 receiving at input the clock signal CK supplied by the oscillator stage 8, and supplying at output, respectively, the negated clock signal CKN and the negated and slowed clock signal CKDN, i.e., a signal having the leading edge slowed down with respect to the negated clock signal CKN; and an edge-regenerator stage 90 receiving at input the negated clock signal CKN and the negated and slowed clock signal CKDN, and supplying at output the above-mentioned first phase signal A and second phase signal B supplied to the booster stages 4 of the voltage-booster circuit 2.

In particular, the first inverter stage 86 comprises a PMOS transistor 92 and an NMOS transistor 94 having gate terminals connected together and receiving the clock signal CK, and drain terminals connected together and defining a node 93. In addition, the PMOS transistor 92 has a source terminal directly connected to the supply line 20, whilst the NMOS transistor 94 has a source terminal connected to the ground line 22 via an NMOS limitation transistor 96. In particular, the NMOS limitation transistor 96 has a drain terminal connected to the source terminal of the NMOS transistor 94, a source terminal connected to the ground line 22, and a gate terminal receiving the biasing voltage $V_{REF}$ supplied by the biasing circuit 26'.

The second inverter stage 88 comprises a PMOS transistor 98 and an NMOS transistor 100 having gate terminals connected together and receiving the clock signal CK, and drain terminals connected together and defining a node 99. In addition, the PMOS transistor 98 has a source terminal connected to the supply line 20 via two PMOS transistors 102, 104 connected in series, whilst the NMOS transistor 100 has a source terminal connected to the ground line 22 via an NMOS limitation transistor 106.

In particular, the NMOS limitation transistor 106 has a drain terminal connected to the source terminal of the NMOS transistor 100, a source terminal connected to the ground line 22, and a gate terminal receiving the biasing voltage $V_{REF}$ supplied by the biasing circuit 26'.

The PMOS transistor 102, instead, has a gate terminal connected to the ground line 22, a drain terminal connected to the source terminal of the PMOS transistor 98, and a source terminal connected to the drain terminal of the PMOS transistor 104, which in turn has a gate terminal connected to the ground line 22 and a source terminal connected to the supply line 20.

The edge-regenerator stage 90 comprises a PMOS transistor 108 and an NMOS transistor 110 having gate terminals connected, respectively, to the node 93 and to the node 99 and receiving, respectively, the negated clock signal CKN and the negated and slowed clock signal CKDN, source terminals connected, respectively, to the supply line 20 and to the ground line 22, and drain terminals connected together and defining a node 109, on which the first phase signal A is present.

The edge-regenerator stage 90 further comprises an inverter 112 having an input connected to the node 109 and receiving the first phase signal A, and an output supplying the second phase signal B; and a feedback structure 114 connected between the output and the input of the inverter 112 and formed by two PMOS transistors 116, 118 connected in series.

In particular, the PMOS transistor 116 has a gate terminal connected to the output of the inverter 112, a source terminal connected to the supply line 20, and a drain terminal connected to the source terminal of the PMOS transistor 118, which in turn has a drain terminal connected to the input of the inverter 112 and a gate terminal connected to the node 93 and receiving the negated clock signal CKN.

The operation of the non-overlapping-signal generator stage 10' is in itself known and consequently will be described only in brief.

The first inverter 86 performs the sole function of inverting the clock signal CK, whilst the second inverter 88 performs the dual function of inverting the clock signal CK and of slowing down its leading edge in such a way that the leading edge of the negated and slowed clock signal CKDN will present a gentler slope than that of the leading edge of the negated clock signal CKN.

The edge-regenerator stage 90 then generates, in a way in itself known, the first phase signal A according to the negated and slowed clock signal CKDN and of the negated clock signal CKN, and this first phase signal A presents a leading edge identical to that of the clock signal CK, i.e., with a slope identical to that of the clock signal CK and time-delayed with respect to the leading edge of the clock signal CK.

Via the inverter 112 and the feedback structure 114, which is controlled not only by the second phase signal B but also by the negated clock signal CKN, the second phase signal B is then generated, which is inverted with respect to the first phase signal A and is not time-overlapped with respect to the first phase signal A, so that a zero crowbar current is obtained in the final drivers.

The non-overlapping-signal generator stage 10' differs from non-overlapping-signal generator stages of the prior art in that it comprises limitation transistors 96 and 106, which perform a function similar to that of the limitation transistors 24.1, 24.2 and 24.3 of the ring oscillator stage 8 shown in FIG. 2, namely, the function of limiting the crowbar current flowing between the supply line 20 and the ground line 22 via the inverters 86 and 88.

In addition, due to the fact that the gate terminals of the limitation transistors 96 and 106 are biased with the biasing voltage $V_{REF}$ supplied by the biasing circuit 26', also the phase signals A and B generated by the non-overlapping-signal generator stage 10' are stable as the temperature and the supply voltage $V_{DD}$ vary, thus contributing to rendering the output voltage $V_{OUT}$ supplied the charge pump 1 stable in voltage and temperature.

The advantages of the embodiment of the present invention are evident from the foregoing description. In particular, it is emphasized that the solution proposed makes it possible to produce a biasing circuit which is simple, occupies a small area and has a decidedly reduced consumption if compared to the band-gap biasing circuits normally used, in particular a consumption lower than 1 $\mu A$.

In addition, in the solution proposed, the biasing circuit is provided with a start-up stage that is regulated directly on the biasing voltage $V_{REF}$ generated, thus guaranteeing that, upon powering-up or during operation, the biasing voltage $V_{REF}$ will always be other than zero.

In addition, with the disclosed embodiment of the invention, consumption of the oscillator during standby is kept constant as the supply voltage and the temperature vary. Finally, it is clear that numerous modifications and variations can be made to the charge pump described and illustrated herein, without thereby departing from the protection scope of the present invention. For example, the non-overlapping-signal generator stage 10' could supply at output a larger number of phase signals than the one described; in particular, it could generate four phase signals A, B, C, D in a way similar to what has been described herein, i.e., using four edge inverters/delayers. In this case, each booster stage 4 would receive at input two of these four phase signals, for example the odd-numbered booster stages 4 could receive the phase signals A, B, whilst the even-numbered booster stages 4 could receive the phase signals C, D.

In addition, the resistor 70 could be replaced by any other electronic component presenting an impedance having a thermal coefficient with sign opposite to that of the thermal voltage $V_T$ of the NMOS transistors 66, 68.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A charge pump, comprising: phase-generating means for generating phase signals, and voltage-boosting means receiving said phase signals; said phase-generating means comprising signal-generating means supplying on an output a clock signal, first current-limiting means for limiting a current flowing in said signal-generating means, and control means supplying on an output a control signal supplied to said current-limiting means; said control means comprise a first current mirror connected to a first line set at a first potential, a second current mirror connected to a second line set at a second potential, and a cascode structure arranged between said first and second current mirrors and connected to said output of said control means for compensating the effects on said control signal caused by sharp relative variations between said potentials; said control means further comprising compensation means for compensating the effects on said control signal caused by slow relative variations between said potentials and by slow variations in temperature such that during a standby mode current consumption is kept constant as temperature and the first and second potentials vary, said phase-generating means further comprise non-overlapping-signal generating means receiving at an input said clock signal and supplying at an output a first said phase signal and at least a second said phase signal; said non-overlapping-signal generating means comprising a first and at least a second inverter stage having respective inputs receiving said clock signal and respective outputs supplying, respectively, a negated clock signal and a negated and slowed clock signal; an edge-regenerating stage having a first input and a second input connected to the outputs of said first and second inverter stages, and a first output and a second output supplying said first and second phase signals; and second current-limiting means receiving said control signal and designed to limit the current flowing in said first and second inverter stages.

2. The charge pump of claim 1, wherein said first current mirror comprises a first transistor and a second transistor having first terminals connected to said first line, second terminals connected to said cascode structure, and control terminals connected together and to said output of said control means; said first and second transistors operating in subthreshold condition, and said compensation means comprising a resistive element arranged between the first terminal of said first transistor and said first line, and presenting an impedance having a thermal coefficient of opposite sign with respect to that of the thermal voltage of said first and second transistors.

3. The charge pump of claim 2, wherein said electronic component is a resistor.

4. The charge pump of claim 1, wherein said cascode structure comprises a third, a fourth, a fifth, and a sixth transistor; said third and fourth transistors having control terminals connected together and to said output of said control means, first terminals connected to said first current mirror, and second terminals connected respectively to said fifth and sixth transistors; said fifth and sixth transistors having control terminals connected together, first terminals connected to said second current mirror, and second terminals connected respectively to said third and fourth transistors; the second terminal of said sixth transistor being further connected to its own control terminal, and the second terminals of said third and fifth transistors being further connected to said output of said control means.

5. The charge pump of claim 1, wherein said signal-generating means comprise a plurality of inverters cascade-connected together; and wherein said first current-limitation means comprise a plurality of first limitation transistors, each of said first limitation transistors being connected in series to a respective one of said inverters and having a control terminal receiving said control signal.

6. The charge pump of claim 1, wherein said control means further comprise start-up means connected to said output of said control means for initializing upon powering-up the control means.

7. The charge pump of claim 1, wherein said second current-limiting means comprise at least a pair of second limitation transistors, each of said second limitation transistors being connected in series to a respective one of said inverter stages and having a control terminal receiving said control signal.

8. A charge pump, comprising: phase-generating means generating phase signals, and voltage-boosting means receiving said phase signals; said phase-generating means comprising signal-generating means supplying on an output a clock signal, first current-limiting means for limiting a current flowing in said signal-generating means, and control means supplying on an output a control signal supplied to said current-limiting means; said control means comprise a first current mirror connected to a first line set at a first potential, a second current mirror connected to a second line set at a second potential, and a cascode structure arranged between said first and second current mirrors and connected to said output of said control means for compensating the effects on said control signal caused by sharp relative variations between said potentials; said control means further comprising compensation means for compensating the effects on said control signal caused by slow relative variations between said potentials and by slow variations in temperature, said phase-generating means further comprise non-overlapping-signal generating means receiving at input said clock signal and supplying at output a first said phase signal and at least a second said phase signal; said non-overlapping-signal generating means comprising a first and at least a second inverter stage having respective inputs receiving said clock signal and respective outputs supplying, respectively, a negated clock signal and a negated and slowed clock signal; an edge-regenerating stage having a first input and a second input connected to the outputs of said first and second inverter stages, and a first output and a second output supplying said first and second phase signals; and second current-limiting means receiving said control signal and designed to limit the current flowing in said first and second inverter stages.

9. A charge pump, comprising: phase-generating means generating phase signals, and voltage-boosting means receiving said phase signals; said phase-generating means comprising signal-generating means supplying on an output a clock signal, first current-limiting means for limiting a current flowing in said signal-generating means, and control means supplying on an output a control signal supplied to said current-limiting means; said control means comprise a first current mirror connected to a first line set at a first potential, a second current mirror connected to a second line set at a second potential, and a cascode structure arranged between said first and second current mirrors and connected to said output of said control means for compensating the effects on said control signal caused by sharp relative variations between said potentials; said control means further comprising compensation means for compensating the effects on said control signal caused by slow relative variations between said potentials and by slow variations in temperature, said phase-generating means further comprise non-overlapping-signal generating means receiving at input said clock signal and supplying at output a first said phase signal and at least a second said phase signal; said non-overlapping-signal generating means comprising a first and at least a second inverter stage having respective inputs receiving said clock signal and respective outputs supplying, respectively, a negated clock signal and a negated and slowed clock signal; an edge-regenerating stage having a first input and a second input connected to the outputs of said first and second inverter stages, and a first output and a second output supplying said first and second phase signals; and second current-limiting means receiving said control signal and designed to limit the current flowing in said first and second inverter stages, said second current-limiting means comprise at least a pair of second limitation transistors, each of said second limitation transistors being connected in series to a respective one of said inverter stages and having a control terminal receiving said control signal.

* * * * *